United States Patent [19]

Stanbery

[11] Patent Number: 4,867,801

[45] Date of Patent: Sep. 19, 1989

[54] TRIPLE-JUNCTION HETEROEPITAXIAL ALGA/CUINSE$_2$ TANDEM SOLAR CELL AND METHOD OF MANUFACTURE

[75] Inventor: Billy J. Stanbery, Seattle, Wash.

[73] Assignee: The Boeing Company, Seattle, Wash.

[21] Appl. No.: 203,727

[22] Filed: Jun. 7, 1988

Related U.S. Application Data

[63] Continuation-in-part of Ser. No. 72,316, Jul. 13, 1987, Pat. No. 4,795,501, which is a continuation-in-part of Ser. No. 792,942, Oct. 30, 1985, Pat. No. 4,680,422.

[51] Int. Cl.$^4$ .................. H01L 31/06; H01L 31/18
[52] U.S. Cl. .................. 136/249; 357/30; 437/2; 437/5
[58] Field of Search .............. 136/249 TJ; 357/30 B, 357/30 E, 30 J; 437/2, 5

[56] References Cited

U.S. PATENT DOCUMENTS

| Re. 31,968 | 8/1985 | Mickelsen et al. | 136/260 |
|---|---|---|---|
| 4,523,051 | 6/1985 | Mickelsen et al. | 136/260 |
| 4,547,622 | 10/1985 | Fan et al. | 136/249 |
| 4,680,422 | 7/1987 | Stanbery | 136/249 |
| 4,684,761 | 8/1987 | Devaney | 136/258 |
| 4,703,131 | 10/1987 | Dursch | 136/258 |
| 4,795,501 | 1/1989 | Stanbery | 136/249 |

OTHER PUBLICATIONS

"High-Efficiency Double-Heterostructure AlGaAs Solar Cells", by Gale et al., Conference Proceedings of the 18th IEEE Photovoltaic Specialists Conference, (IEEE New York 1985), pp. 296-299.

Primary Examiner—Aaron Weisstuch
Attorney, Agent, or Firm—Foley & Lardner, Schwartz, Jeffery, Schwaab, Mack, Blumenthal & Evans

[57] ABSTRACT

An ultra-high-efficiency, monolithic, heteroepitaxial solar cell having a high specific power is disclosed. The solar cell includes three photoactive regions connected in series by their structure as a substantially single crystal multilayer film. The three photoactive junctions are in tandem optically. The upper cell, having the highest bandgap, is exposed to the entire solar spectrum, wherein those wavelengths whose energy is less than the upper cell's bandgap are transmitted to the two underlying cells. The intermediate cell similarly filters the solar spectrum transmitted to the lower cell which has the lowest bandgap.

30 Claims, 1 Drawing Sheet

U.S. Patent  Sep. 19, 1989  4,867,801
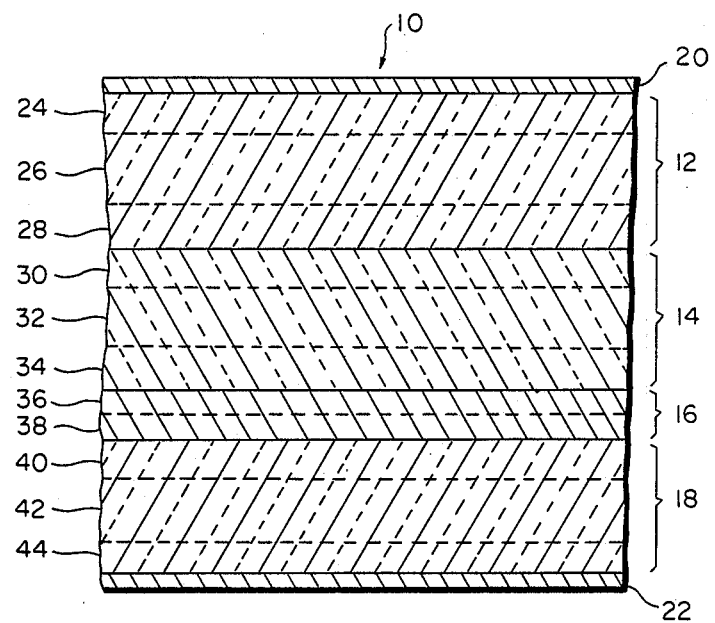

TRIPLE-JUNCTION HETEROEPITAXIAL ALGA/CUINSE$_2$ TANDEM SOLAR CELL AND METHOD OF MANUFACTURE

REFERENCE TO RELATED APPLICATION

The present invention is a continuation-in-part application of Ser. No. 072,316, entitled "Single Crystal, Heteroepitaxial, GaAlAs/CuInSe$_2$ Tandem Solar Cell and Method of Manufacture", filed July 13, 1987, now U.S. Pat. No. 4,795,501, the contents of which are hereby incorporated by reference, which is in turn a continuation-in-part application of Ser. No. 792,942, filed Oct. 30, 1985, now U.S. Pat. No. 4,680,422.

BACKGROUND OF THE INVENTION

The present invention relates to high efficiency solar cells, and particularly to a high efficiency tandem solar cell composed of a substantially single crystal heteroepitaxial multilayer film to form three photoactive junctions electrically connected in series, and to its method of manufacture.

Spacecraft power systems require a technology that provides high solar energy conversion efficiency at a high specific power (power/mass) and high resistance to radiation present in the space environment. Photovoltaic solar cell arrays have been used extensively in spacecraft power systems, but to date have been limited to specific powers in the range of about 300 watts/kg. NASA goals for space power arrays call for specific powers for the array in excess of 300 watts/kg to reduce the mass and drag of the spacecraft power system and thereby increase payload capacity. The individual cells used in such an array must have specific powers well in excess of 300 watts/kg if the resulting array goal is to be achieved, as the hardware of the array reduces the specific power by adding weight without increasing power output.

The use of I-III-VI$_2$ semiconductor cells (i.e. CuInSe$_2$) in photovoltaic solar cell arrays can offer significant advantages over silicon solar cells in meeting the aforementioned array requirements, including:

(1) The CuInSe$_2$ cell can generally be made thinner than conventional silicon cells thereby offering the potential of an extremely high specific power.

(2) Radiation testing has shown (i) that the CuInSe$_2$ cell is at about 50 times more resistant to 1 MeV protons than silicon cells, and (ii) that the cell also possesses an inherent tolerance to irradiation by 1 MeV electrons up to at least $2 \times 10^{16}$ electrons/cm$^2$. At this level, typical silicon cells are degraded by over 50%. Because of the radiation hardness of the CuInSe$_2$ cell, reduced radiation shielding is required which results in an even higher specific power. By using the equivalent radiation shielding on CuInSe$_2$ cells as used on silicon cells, a higher end of life efficiency can be achieved for CuInSe$_2$ as well as higher specific power.

(3) Annealing of the cell, after proton irradiation, at 200° C. for six minutes restores the CuInSe$_2$ cell to within 95% of its initial efficiency.

CuInSe$_2$ (i.e. CIS) semiconductors suitable for solar cells are described by Mickelsen and Chen in U.S. Pat. No. Re. 31,968 and U.S. Pat. No. 4,523,051, both of which are hereby incorporated by reference. The disclosed CuInSe$_2$/(Cd,Zn)S cells were deposited on relatively thick substrates selected from polycrystalline alumina, glazed alumina, enameled steel, metal foils, and similar inert inorganic materials. Typically, the substrate had a thickness of at least about 25 mils and was preferably either 25 mil alumina or 60 mil soda lime glass. Cells of this type had efficiencies on the order of 10% AMO, but the specific power of the cells was reduced by the mass of the substrate. Thus, while the soda lime glass or alumina substrates were satisfactory for terrestrial applications, a much lighter substrate was required to meet the demands for modern space power applications.

U.S. Pat. No. 4,703,131 by Dursch describes an improved CuInSe$_2$ solar cell having a specific power in excess of 400 watts/kg and comprising a (Cd,Zn)S/CuInSe$_2$ thin film on a 5 mil titanium metal foil. The higher specific power results from a more efficient transducer and a much lighter substrate. To achieve the maximum efficiencies and specific powers, efforts have been made to produce tandem solar cells having a potential specific power of at least 1000 watts/kg and a conversion efficiency of better than 20%. For example, U.S. patent application Ser. No. 072,316 (now U.S. Pat. No. 4,795,501) describes a monolithic, heteroepitaxial, double junction, GaAlAs/CuInSe$_2$, tandem solar cell having a conversion efficiency of about 25% or higher with a specific power of at least about 1000 watts/kg. In the cell, the lattice mismatch transition zone comprises an epitaxial layer of ZnSSe adjacent a p$^+$-minority carrier confinement layer of a CLEFT double heterostructure, single crystal GaAlAs upper cell followed by a CdZnSeS layer adjacent a CuInSe$_2$ lower cell. The tandem cell combines an upper cell noted for its high electron mobility and high absorption coefficient with an inexpensive thin film lower cell noted for its high absorption coefficient and good electron mobility.

The present invention provides a monolithic tandem solar cell having a potential efficiency of at least about 30% AMO and a specific power potential of over 1000 watts/kg at the cell level (with coverglass), as well as superior radiation resistance. Such a cell is easier to manufacture than the double junction of my earlier patent.

SUMMARY OF THE INVENTION

The present invention provides an ultra-high-efficiency, monolithic, heteroepitaxial solar cell having a high specific power. The solar cell includes three photoactive regions connected in series by their structure as a substantially single crystal multilayer film. The three photoactive junctions are in tandem optically. The upper cell, having the highest bandgap, is exposed to the entire solar spectrum, wherein those wavelengths whose energy is less than the upper cell's bandgap are transmitted to the two underlying cells. The intermediate cell similarly filters the solar spectrum transmitted to the lower cell which has the lowest bandgap.

BRIEF DESCRIPTION OF THE DRAWING

The FIGURE shows a schematic cross-section through a preferred solar cell according to the present invention.

DETAILED DESCRIPTION OF PREFERRED EMBODIMENT

Referring now to the FIGURE, a triple-junction solar cell 10 according to a preferred embodiment of the invention is shown having four basic elements, an upper cell 12, an intermediate cell 14, a lattice mismatch transition zone 16, and a lower cell 18. The solar cell 10 also includes one or more antireflection coatings 20 and an electrical back contact and/or a Back Surface Reflector (BSR) and contact 22.

The upper cell 12 is composed of a CLEFT, $Al_xGa_{1-x}As$, thin film, single crystal solar cell wherein $0.9 \leq x 0.20$. The process of making thin film solar cells of this general type has been described by R. Gale et al. of MIT at *Conf. Proceedings of the 18th IEEE Photovoltaic Specialists Conf.*, (IEEE, N.Y., 1985) p. 296 and in U.S. Pat. No. 4,547,622. The upper cell 12 is preferably a double heterostructure type having variable values of x in different layers of the structure as discussed in U.S. patent application Ser. No. 072,316, including a n+-type AlGaAs region 24 (emitter), a p-type bulk AlGaAs region 26 (base), and a p+-type AlGaAs minority carrier confinement layer or mirror 28. The composition of the p-type region 26 should be limited to less than about 42% of Al, where the alloy becomes an indirect absorbing semiconductor and preferably is in the range of about 37% Al where the critical point fluctuations near the direct-indirect transition have less effect on carrier mobility. The upper cell 12 has an effective bandgap in the range of 1.85–2.00 eV.

The intermediate cell 14 ($Al_yGa_{1-y}As$) is similar in structure to the upper cell 12 and also contains a n+-type AlGaAs region 30, a p-type AlGaAs region 32, and a p+-type AlGaAs region 34. The p-type region 32 of the intermediate cell 14, however, has values of y ranging between $0.20 \leq y \leq 0$, preferably between $0.05 \leq y \leq 0$, and has a thickness of at least one-half (0.5) micron. The p-type region 32 of the intermediate cell 14, therefore, is richer in Ga than the p-type region 28 of the upper cell 12 and the intermediate cell 14 has an effective bandgap on the order of 1.42–1.60 eV. The n+-type region 30 and the p+-type region 34 may contain substantially higher values for y ranging up to 1.0. For example, the p+-type region preferably includes a p+-AlAs (y=1) component layer at or within about 0.15 microns of the interface between the intermediate cell 14 and the lower cell 18.

The lattice mismatch transition zone 16 and the lower cell 18 are equivalent to the mismatch transition zone and lower cell disclosed in copending application Ser. No. 072,316. Specifically, the lattice mismatch transition zone 16 includes a II-VI alloy than generally includes an n+-type $ZnS_xSe_{1-x}$ epitaxial layer 36 deposited on the p+-type region 34 of the intermediate cell 14. Although shown for convenience in the FIGURE as a distinct, relatively thick layer, the epitaxial layer 36 is compositionally graded over the course of depositing the transition zone 16 to an n-type $Cd_yZn_{1-y}S_zSe_{1-z}$ layer 38, where $0.10 \leq y \leq 0.90$ and z can assume any value.

Based upon lattice-match considerations, the transition zone 16 should be prepared from $Zn_{0.7}Cd_{0.3}Se$ or $Cd_{0.88}Zn_{0.12}Se$ at the junction with the $CuInSe_2$ lower cell, thus providing an acceptable energy gap. The selection of the composition for the transition zone, however, is much more difficult than simple lattice-match considerations would indicate, because the efficiency of the solar cell 10 will be dependent upon the more important factors of interdiffusion of species at the junction during deposition of the lower cell and the electron affinity of the II-VI alloy at the junction. Theory is lacking or disputed, especially with respect to band off-sets, for directing the optimal composition in this region of the transition zone. Success depends upon minimizing electron traps or barriers to electron injection at the junction. Preferably an ungraded, degenerately doped ZnSe layer can be used, but those skilled in the art will be able to produce a suitable material of $Cd_yZn_{1-y}S_zSe_{1-z}$ within the desired characteristics without undue experimentation. The material selection is dependent upon, in part, the deposition technique used for the lower cell 18, thus a more precise definition of the lower transition zone 38 is not possible without specifying the process for making the lower cell.

The solar cell 10 is completed by epitaxially depositing the $CuInSe_2$ lower cell 18 onto the $Cd_yZn_{1-y}S_zSe_{1-z}$ lower transition layer 38, since the transition zone 16 has provided adequate flexibility to optimize the electron affinity.

The lower cell 18 may include three regions, as discussed by Devaney in U.S. Pat. No. 4,684,761, including a copper-deficient region 40 adjacent the transition zone 16, a bulk region 42 of p-type $CuInSe_2$, and a third region 44, rich in selenium, of p+-type $CuInSe_2$ for the back near contact region. The lower cell 18 should be deposited at low temperatures of around 200° C. or less to minimize the diffusion of copper into either or both layer(s) 36, 38 of the transition zone 18. The precise structure and composition of the lower cell 18, depends upon the precise nature of the transition zone 16 and the actual method of depositing the lower cell. Since copper is particularly active in interdiffusion, its depletion in or near the transition zone/lower cell junction is probably highly desirable. The lower cell 18 should be made to optimize its performance in tandem with the AlGaAs upper and intermediate cells.

As suggested by Devaney, the ratio of the fluxes of copper, indium, and selenium should be controlled during the reactive evaporation (i.e. deposition of the lower cell 18) to achieve the three-region lower cell. The uppermost layer 40 of the lower cell 18 that abuts the transition zone 16 and forms the junction generally is a thin layer deficient in copper to increase the resistivity near the junction with the transition zone 16. This uppermost layer forms a p-n type transient homojunction in the $CuInSe_2$, wherein the term is intended also to encompass a (p-i-n) type junction as well.

Below the uppermost layer, and forming the bulk region of the lower cell 18, a p-type layer 42 is formed by adjusting the fluxes and their ratios. The lower cell 18 is completed with a very thin film third region 44 that is rich in selenium.

The reactive evaporation can be done at low temperatures and a pressure of about $3-8 \times 10^{-6}$ torr in the presence of hydrogen to promote mixing (as described in U.S. Pat. No. 4,523,051).

While Devaney suggests temperatures between 355°–455° C., preferably the $CuInSe_2$ lower cell 18 is deposited at lower temperatures around 300° or less to minimize diffusion of copper into the transition zone, as previously described. The deposition temperatures should be held as low as possible without sacrificing the quality of the lower cell.

The metalized back contact or Back Surface Reflector 22 (generally of Mo) is deposited on the lower cell 18 to complete the solar cell 10, and may be in grid or blanket form.

Conversion efficiencies are improved by subsequently depositing one or more antireflection coatings 20 of $TiO_2$, ZnS or other conventional materials alone or in combination on the upper cell 12. Grid metalization (not shown), as required, is also included.

The upper cell 12 has a total thickness of less than 20 microns, and preferably 2-5 microns. The intermediate cell 14 has a thickness of 1-400 microns, and preferably less than 10 microns. The lower cell 18 has a total thickness of less than 10 microns, and preferably less than 5 microns.

The triple-junction solar cell 10 can be made with the aforementioned thin film CLEFT processing technique in which a CLEFT buffer is grown on a suitable removable substrate, and the layers for the upper cell 12, the intermediate cell 14, the transition zone 16, and lower cell 18 are then deposited sequentially and epitaxially on the buffer. The back contact 20 is then deposited on the lower cell 18, and the substrate is removed prior to front side processing in which the buffer is etched away and contact gridding and anti-reflection coatings are added. Because the solar cell 10 has the deposition substrate removed in the completed cell, the lower cell does not require the substrate that is conventionally used in a conventional bottom-to-top cell manufacture, thereby improving the specific power of the completed solar cell. The CLEFT process, however, is more complicated and difficult to commercialize than bulk processing techniques. Accordingly, an significant advantage of the triple junction solar cell 10 over my double junction cell of Ser. No. 072,316 is that the triple junction manufacture can employ less complicated and expensive bulk processing techniques as well as thin film techniques. That is, the triple junction can be manufactured by growing the intermediate cell 14 and upper cell 12 on the front side of a GaAs wafer and growing the lattice transition zone 16 and the lower cell 18 on the backside. The back side contact 22 is then deposited and frontside cell processing is completed. In this technique a bulk region of the cell serves as the substrate during stages of the deposition.

The particular process chosen to manufacture the solar cell 10 will undoubtedly depend on the intended application. For example, the lower mass of the thin film version is desirable in space applications, while the low-cost of the bulk cell may be desirable in terrestrial applications.

Triple-junction solar cells according to the present invention may realize conversion efficiencies of 30% AMO or higher, and provide specific powers of 1000 watts/kg or more. The inherent properties of the cells also make them extremely resistant to radiation.

The upper and intermediate cells might also be prepared from other Group III and Group V materials, including $In_{0.85}Al_{0.15}P$ or $GaAs_{0.8}P_{0.2}$, although the suitability of these upper cells in heteroepitaxial processes with II-VI alloys is not well established. The energy gaps (bandgaps) and lattice constants of the III-V alloys, however, identify them as suitable candidates for further investigation.

The invention has been described with reference to certain preferred embodiments thereof, it will be understood, however, that variations and modifications within the spirit and scope of the invention are possible and will be recognized by those of ordinary skill in the art. For example, the upper and intermediate cells may simply be a GaAs thin film or other III-V alloys. Therefore, the claims should be interpreted liberally in view of the disclosure and should be limited only as necessary in view of the pertinent prior art.

What is claimed is:

1. A high efficiency tandem solar cell, comprising:
   a. an $Al_xGa_{1-x}As$ upper cell;
   b. an $Al_yGa_{1-y}As$ intermediate cell;
   c. a transition zone attached to the intermediate cell to match the lattice structure of $Al_yGa_{1-y}As$ to $CuInSe_2$; and
   d. a $CuInSe_2$ lower cell.

2. The solar cell of claim 1, wherein said upper cell has an effective bandgap range of about 1.85-2.00 eV and said intermediate cell has an effective bandgap range of about 1.42-1.60 eV.

3. The solar cell of claim 1, wherein said intermediate cell includes a bulk region having a value of y in the range of about $0.20 < y \leq 0$.

4. The solar cell of claim 3, wherein said intermediate cell includes a bulk region having a value of y in the range of about $0.05 \leq y \leq 0$.

5. The solar cell of claim 3, wherein said bulk region has a thickness of at least one-half micron.

6. The solar cell of claim 1, wherein said upper cell has a value of x in the range of $0.9 \leq x \leq 0.20$.

7. The solar cell of claim 1 wherein said upper cell has a thickness of less than 20 microns, said intermediate cell has a thickness in the range of 1-400 microns, and the lower cell has a thickness of less than 10 microns.

8. The solar cell of claim 1, wherein said solar cell has an efficiency of approximately 30% AMO or greater and a specific power of at least about 1000 watts/kg.

9. The solar cell of claim 1, wherein said upper cell and intermediate cell comprise a double-heterostructure.

10. The solar cell of claim 9, wherein said upper cell and intermediate cell comprise a single crystal.

11. The solar cell of claim 1, wherein the transition zone includes at least on II-VI alloy.

12. The solar cell of claim 1, wherein the transition zone includes a first II-VI alloy forming an upper junction with the intermediate cell and a second II-VI alloy forming a lower junction with the lower cell.

13. The solar cell of claim 1, wherein the transition zone include a first region of $ZnS_xSe_{1-x}$ attached to the intermediate cell and a second region of $Cd_yZn_{1-y}S_zSe_{1-z}$ attached to the first region and the lower cell.

14. The solar cell of claim 1, wherein the $CuInSe_2$ lower cell is heteroepitaxially deposited on the transition zone.

15. The solar cell of claim 1, wherein the $CuInSe_2$ lower cell is p-type and comprises a first region deficient in copper, a second region comprising the p-type bulk of the lower cell, and a third region rich in selenium.

16. The solar cell of claim 1, wherein said intermediate cell has a $p^+$-AlAs component layer within about 0.15 microns of the interface between the intermediate cell and the lower cell.

17. A method of making a solar cell comprising the steps of:
   a. forming a CLEFT buffer on a removable substrate;
   b. depositing an upper cell on said CLEFT buffer;
   c. depositing an intermediate cell on said upper thin film cell;
   d. forming a lattice mismatch transition zone on said intermediate cell;
   e. depositing a lower cell on said lattice mismatch transition zone;
   f. depositing a back contact on said lower cell;
   g. separating the layers deposited in steps a-f from said substrate; and
   h. removing said CLEFT buffer from said upper cell.

18. The method of claim 17, wherein said upper cell is formed to have an effective bandgap range of about 1.85–2.00 eV and said intermediate cell is formed to have an effective bandgap range of about 1.42–1.60 eV.

19. The method of claim 17, wherein said intermediate cell is formed of $Al_yGa_{1-y}As$ and includes a bulk region having a value of y in the range of about $0.20 \leq y \leq 0$.

20. The method of claim 19, wherein said bulk region is formed having a value of y in the range of about $0.05 \leq y \leq 0$.

21. The method of claim 17, wherein said upper cell is formed of $Al_xGa_{1-x}As$ where x has a value in the range of $0.9 \leq x \leq 0.20$.

22. The product of the process of claim 17.

23. A method of making a high efficiency tandem solar cell comprising the steps of:
   a. preparing a GaAs substrate having an upper and a lower surface;
   b. depositing an intermediate cell comprising $Al_yGa_{1-y}As$ on the upper surface of said GaAs substrate;
   c. depositing an upper cell comprising $Al_xGa_{1-x}As$ on said intermediate cell;
   d. depositing a lattice mismatch transition zone on the lower surface of said substrate; and
   e. depositing a I–III–VI$_2$ photoactive cell on said lattice mismatch transition zone.

24. The method of claim 23, wherein said upper cell is formed to have an effective bandgap range of about 1.85–2.00 eV and said intermediate cell is formed to have an effective bandgap range of about 1.42–1.60 eV.

25. The method of claim 23, wherein said bulk region is formed having a value of y in the range of about $0.05 \leq y \leq 0$.

26. The product of the process of claim 23.

27. A triple-junction, monolithic heteroepitaxial solar cell, comprising:
   a. an upper cell of a III–V alloy;
   b. an intermediate cell of a III–V alloy deposited on the upper cell;
   c. a lattice-mismatch transition zone deposited on the intermediate cell; and
   d. a lower cell of a I–III–VI$_2$ alloy deposited on the transition zone.

28. The solar cell of claim 27, wherein the upper cell has a bandgap of between about 1.85–2.00 eV and the intermediate cell has a bandgap of between about 1.42–1.60 eV.

29. The solar cell of claim 28, wherein the upper cell is an $Al_xGa_{1-x}As$ alloy, the intermediate cell is an $Al_yGa_{1-y}As$, the transition zone includes at least one II–VI alloy, and the lower cell is a $CuInSe_2$ alloy deficient in copper in the region adjacent the transition zone.

30. The solar cell of claim 27, wherein the transition zone includes a II–VI alloy.

* * * * *